(12) United States Patent
Choy et al.

(10) Patent No.: US 7,649,333 B2
(45) Date of Patent: Jan. 19, 2010

(54) ACTIVE DAMPING DEVICE FOR A POSITIONING STAGE

(75) Inventors: Ping Kong Joseph Choy, Hong Kong (HK); Siu Wing Or, Hong Kong (HK); Chung Sheung Yung, Hong Kong (HK); Chou Kee Peter Liu, Kwai Chung (HK); Lai Wa Helen Chan-Wong, Hong Kong (HK)

(73) Assignee: ASM Assembly Automation Ltd., Hong Kong (HK)

( * ) Notice: Subject to any disclaimer, the term of this patent is extended or adjusted under 35 U.S.C. 154(b) by 388 days.

(21) Appl. No.: 11/623,171

(22) Filed: Jan. 15, 2007

(65) Prior Publication Data

US 2008/0169781 A1 Jul. 17, 2008

(51) Int. Cl.
*G05B 5/01* (2006.01)
(52) U.S. Cl. .................................. 318/649; 318/611
(58) Field of Classification Search .......... 318/611, 318/648, 649
See application file for complete search history.

(56) References Cited

U.S. PATENT DOCUMENTS

| | | | | |
|---|---|---|---|---|
| 6,325,351 | B1 * | 12/2001 | Hale et al. | 248/562 |
| 6,700,715 | B2 * | 3/2004 | Sorg et al. | 359/824 |
| 7,336,344 | B2 * | 2/2008 | Kimura | 355/75 |
| 2004/0100007 | A1 * | 5/2004 | Engwall et al. | 267/140.13 |
| 2004/0189145 | A1 * | 9/2004 | Pletner et al. | 310/311 |

* cited by examiner

*Primary Examiner*—Bentsu Ro
(74) *Attorney, Agent, or Firm*—Ostrolenk Faber LLP (57) ABSTRACT

A damping apparatus is provided for a positioning stage that is operative to move and position an object along a motion axis. The damping apparatus comprises a motion transformation device operative to rotate the positioning stage about a rotary axis that is substantially perpendicular to the motion axis, in response to forces generated to the positioning stage during acceleration or deceleration thereof. Resilient elements connected to the positioning stage serve to reduce transmission of vibration generated from the positioning stage.

18 Claims, 6 Drawing Sheets

Prior Art

FIG. 1

Prior Art

ACTIVE DAMPING DEVICE FOR A POSITIONING STAGE

FIELD OF THE INVENTION

This invention relates generally to positioning devices including mounting stages, and more particularly to the reduction of vibration caused when such devices are driven at high acceleration/deceleration.

DESCRIPTION OF THE RELATED ART

In precision manufacturing such as microelectronics manufacturing, positioning devices such as positioning stages for mounting objects that are moved in one or more directions (x, y, z, $\alpha$, or $\beta$) are used to provide the necessary precision movement. The positioning device is mounted on a supporting structure and carries electronic devices (such as semiconductors and the carriers on which they are mounted) to a target position for other functional units (such as a vision recognition device or a bonding tool) mounted on the same supporting structure to process. The supporting structure (typically the equipment panel of a machine frame) is usually resting on a foundation via some spring or damper systems so that external vibrations transmitted to the supporting structure are reduced.

Although the supporting structure is isolated from external vibrations by the spring or damper systems, the high acceleration and deceleration (2 G-4 G) of the positioning device during its motions generate reaction forces to its base and excite the supporting structure as well as the functional units to cause them to vibrate. These vibrations misalign the positions of the functional units relative to the stage device and cause difficulties in performing precision tasks such as wire bonding. As integrated circuit density increases (resulting in a greater need for increased speed and production throughput) and feature size decreases (resulting in greater need for precision), they also make the alignment of the positioning device relative to the functional units more difficult. It is thus a technological challenge to increase productivity while maintaining precision during high precision manufacturing involving high acceleration motion.

Figure 1:
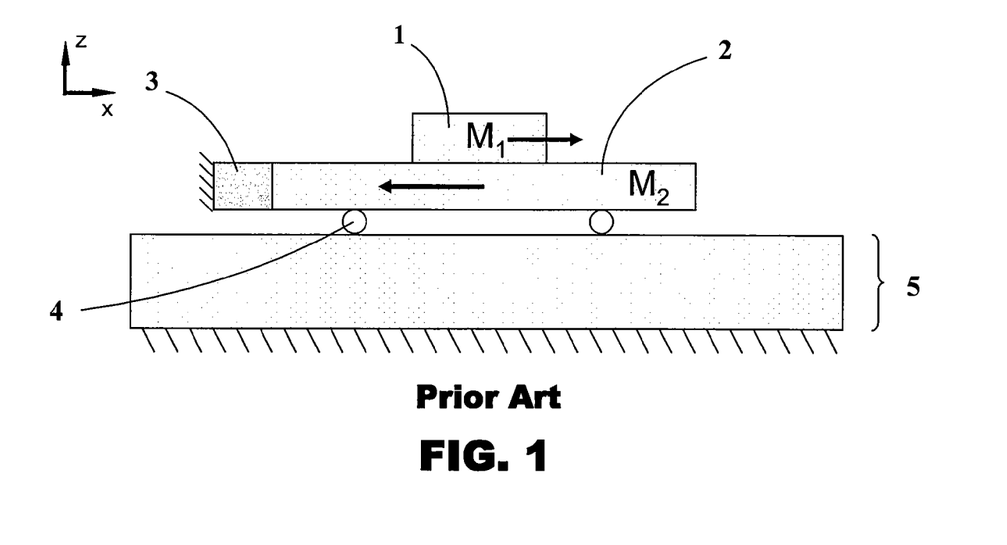
FIG. 1 is a schematic diagram of a prior art positioning device using a large reaction mass relative to a positioning stage.

In order to achieve both the aforementioned production and precision requirements in manufacturing, several methods have been developed for positioning devices including positioning stages for canceling the reaction forces. FIG. 1 is a schematic diagram of a prior art positioning device using a large reaction mass relative to a positioning stage. The device base 2 is allowed to move on bearings 4 mounted onto a support structure 5 so as to reduce the amplitude of reaction forces acting on the device base 2. It is attached on one end 3 to a fixed support. By conservation of momentum, the change in velocity of the device base 2 will be proportional to the difference between the mass ratios $M_1$ and $M_2$ of the positioning device 1 and its base 2 respectively. Due to its large size in comparison with the positioning device 1, the device base 2 acts as a massive reaction mass to store the energy of the reaction forces acting on the device base 2 as kinetic energy. For example, when a positioning device 1 weighing 50 kg travels 100 mm in the x direction, its base 2 weighing 500 kg may travel 10 mm in the −x direction and the vibration produced in the system as a whole is minimized.

Figure 2:
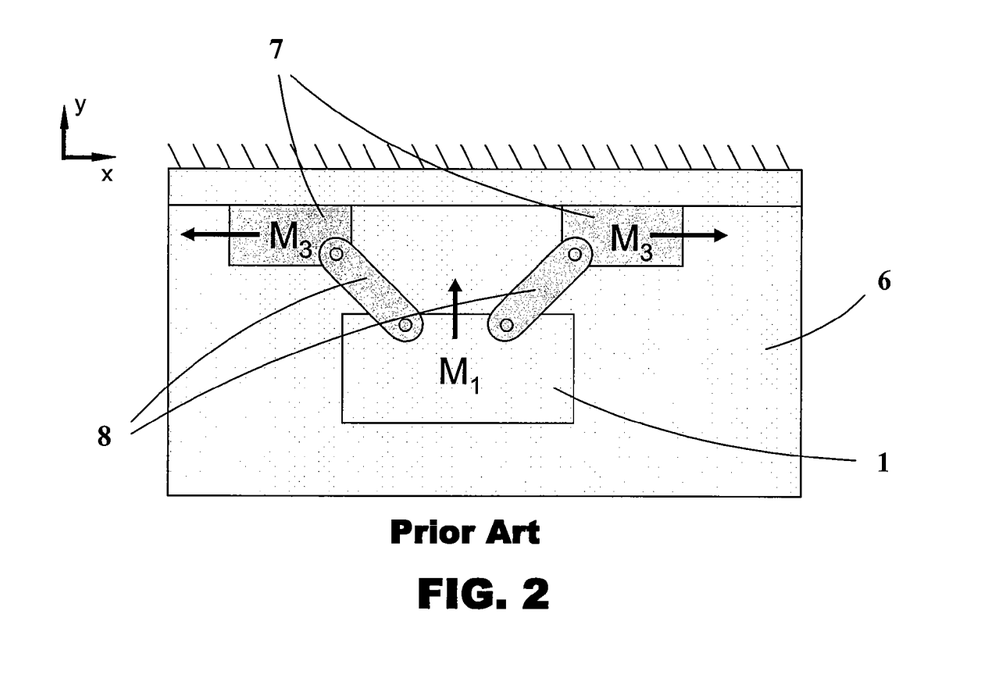
FIG. 2 is a schematic diagram of another prior art positioning device using carriages which move in opposite directions along a first axis in order to move a table along another axis through linkages.

FIG. 2 is a schematic diagram of another prior art positioning device using carriages which move in opposite directions along a first axis in order to move a table along another axis through linkages. Here, a moving table 1 that is movable along a second axis is driven by the two carriages 7 arranged along the first axis through linkages 8. The two carriages 7 are arranged to move in opposite directions along the first axis to cause the moving table 1 to move along the second axis which is perpendicular to the first axis such that reaction forces generated when the carriages 7 move are cancelled by their counter-masses arrangement. A reaction mass 6 is arranged below and supports the first and second carriages 7 to cancel the reaction forces generated when the two carriages 7 both move along the first axis in opposite directions.

Although these configurations are generally effective for vibration transmission reduction, position restoration in these stage devices is difficult because of the lack of a determinable reference point for restoration. Moreover, the large assemblies of the positioning device incorporating these force cancellation mechanisms or reaction masses can introduce large shifts of the center of gravity during motion of the respective stages. Hence it would be advantageous to provide a platform installed underneath the stage device that can reduce vibration transmission while avoiding any major modifications to prior art stage devices.

SUMMARY OF THE INVENTION

It is thus an object of the invention to reduce vibration in a high acceleration/deceleration positioning device including a positioning stage while driving the stage.

It is another object of the invention to restore the orientation of the positioning stage to its equilibrium or non-rotary orientation after the positioning device has undergone vibration.

According to a first aspect of the invention, there is provided a damping apparatus for a positioning stage that is operative to move and position an object along a motion axis, the damping apparatus comprising a motion transformation device operative to rotate the positioning stage about a rotary axis that is substantially perpendicular to the motion axis in response to forces generated to the positioning stage during acceleration or deceleration thereof, and resilient elements connected to the positioning stage to reduce vibration transmission.

According to a second aspect of the invention, there is provided a method for damping vibrations of a positioning stage for moving and positioning an object along a motion axis, comprising the steps of: driving the positioning stage to move the object along the motion axis, rotating the positioning stage about a rotary axis that is substantially perpendicular to the motion axis in response to forces generated to the positioning stage during acceleration or deceleration thereof using a motion transformation device, and reducing vibration transmission with resilient elements connected to the positioning stage.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The invention may be best understood by reference to the following description taken in conjunction with the accompanying drawings in which.

DETAILED DESCRIPTION OF THE PREFERRED EMBODIMENTS OF THE INVENTION

Reference will now be made in detail to a preferred embodiment of the apparatus and method consistent with the principles of the present invention. It is to be understood that both the foregoing general description and the following detailed description are exemplary and explanatory only and are not restrictive of the invention as claimed. The advantages of the present invention will become apparent upon reading the following detailed description and studying the figures.

Figure 3:
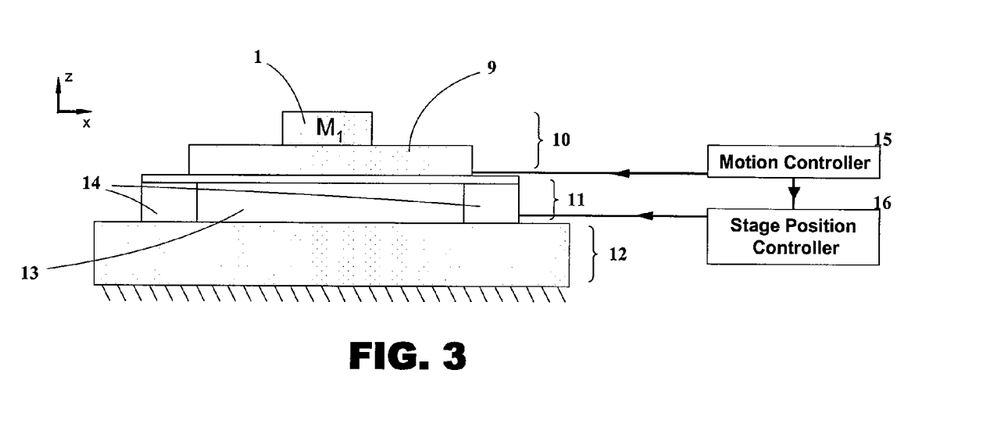
FIG. 3 is a schematic diagram of a positioning stage device according to the preferred embodiment of the invention incorporating a damping apparatus having a motion transformation device and a positioning mechanism.

FIG. 3 is a schematic diagram of a positioning stage device according to the preferred embodiment of the invention incorporating a damping apparatus 11 having a motion transformation device 13 and a positioning mechanism 14. A positioning stage 10 is mounted on the damping apparatus 11, which is in turn mounted onto a supporting structure 12. The damping apparatus 11 is designed to be modular and compatible to the mounting methods of modern state-of-the-art positioning stages 10. The positioning stage 10 mounted on the damping apparatus 11 can reduce vibration transmission from the positioning stage base 9 to the supporting structure 12, for example, a machine frame.

The positioning stage 10 is operative to move and position an object along a motion axis. The dynamic behavior of the positioning stage 10 is controlled by the damping apparatus 11 and also the stage position controller 16 according to motion commands from the motion controller 15. The damping apparatus 11 responds to the motion commands to reduce vibration transmission and to maintain position accuracy at different time intervals based on a designated motion profile of the positioning stage 10.

Figure 4:
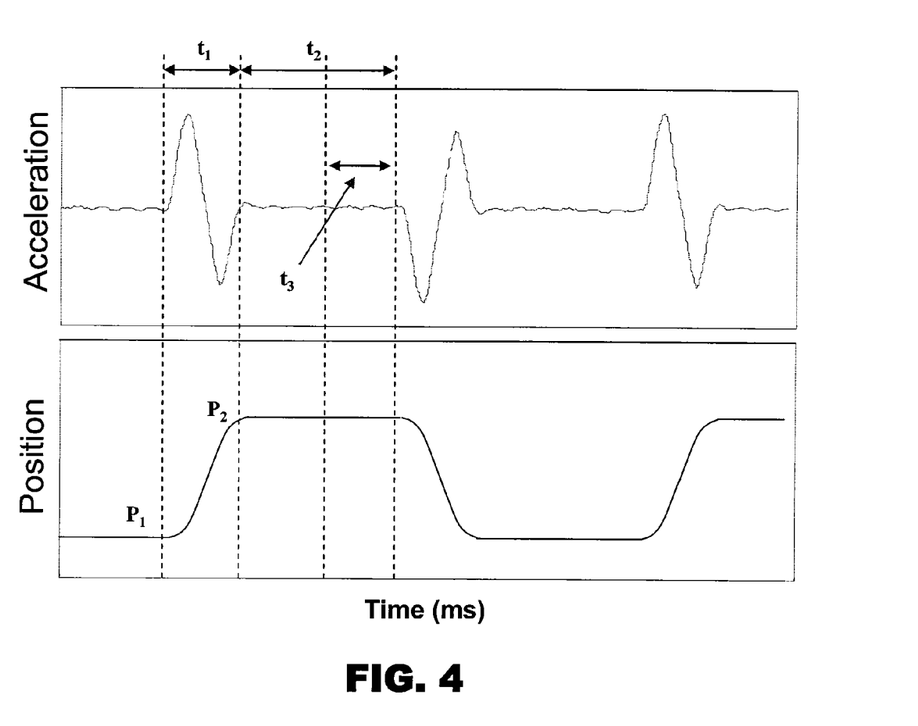
FIG. 4 is a typical motion profile of a positioning stage showing its positions during motion and its acceleration at each position.

FIG. 4 is a typical motion profile of a positioning stage showing its positions during motion and its acceleration at each position. A moving table 1 of the positioning stage 10 has a mass $M_1$ and accelerates in a triangular-like waveform fashion. It achieves its maximum acceleration/deceleration within a very short period of time (in terms of milliseconds) $t_1$ between a start position $P_1$ and an end position $P_2$. After reaching position $P_2$, the moving table 1 holds its position for a duration $t_2$.

During this period, the positioning stage 10 is allowed to rotate and tilt about a rotary axis (preferably a horizontal axis) that is substantially perpendicular to the motion axis in response to reaction forces generated to the positioning stage 10 during acceleration or deceleration thereof in order to transform the reaction forces acting on the positioning stage base 9 into kinetic energy in the positioning stage 10. In this way, vibrations caused by such reaction forces can be reduced.

The positioning mechanism 14 will optionally also reduce the tilting of the positioning stage 10 by using its damping and locking mechanism. Such a positioning mechanism 14 of the damping apparatus 11 is usually only required to restore the position of the positioning stage 10 when precision operations are required to be performed on the positioning stage 10 during time period $t_3$. The actions and timing of the damping apparatus 11 are responsive to control signals from the stage position controller 16, which operates in response to the motion commands given by the motion controller 15.

Figure 5:
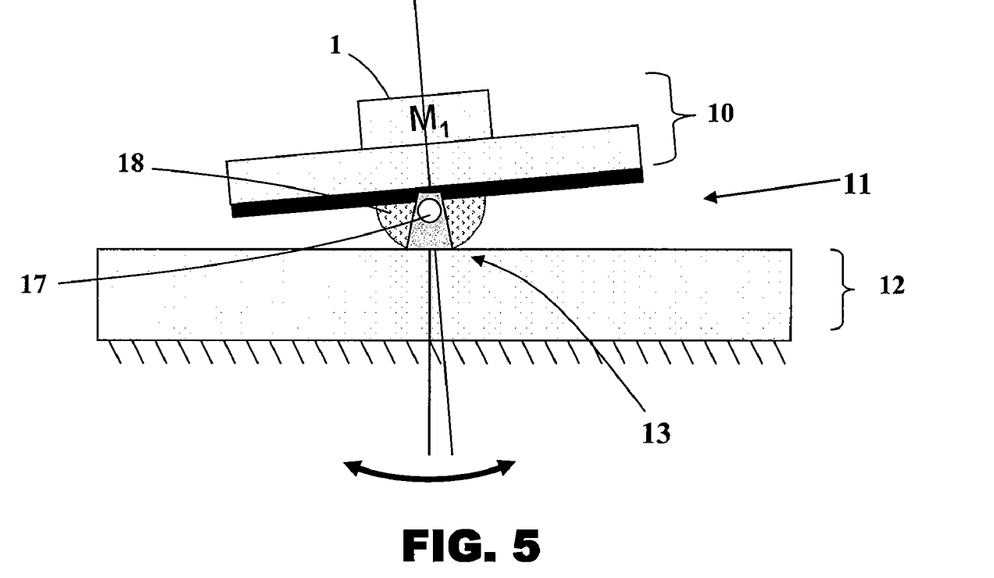
FIG. 5 is the schematic diagram showing the motion transformation device of the positioning stage device according to the preferred embodiment of the invention.

FIG. 5 is the schematic diagram showing the motion transformation device of the positioning device according to the preferred embodiment of the invention. The motion transformation device 13 of the damping apparatus 11 contains a tilting mechanism which incorporates a pivot 17 and a set of resilient elements, such as elastic elements 18 connected to the positioning stage and the supporting structure 12. They are arranged within the damping apparatus 11 to modify the motion of the positioning stage 10.

According to the first principle of the present invention, the motion transformation device 13 allows the positioning stage 10 mounted on it to tilt about the pivot 17. This is different from prior art designs which let the whole positioning stage 10 together with its base 9 translate freely to reduce vibration transmission. The present invention only allows the positioning stage 10 to move about the pivot 17. The pivot 17 is arranged underneath the positioning stage 10 at a vibrational nodal point of the positioning stage 10 which encounters the lowest level of vibration in the tilting mode when the positioning stage 10 rotates. The pivot 17 allows the positioning stage 10 to tilt relative to the support structure 12.

Figure 6:
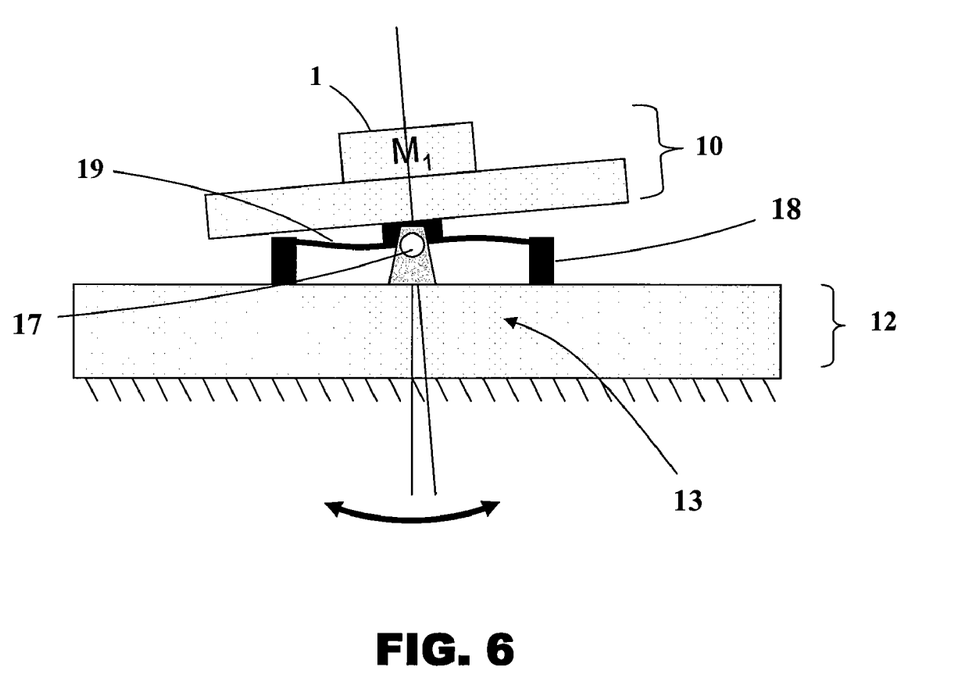
FIG. 6 shows one of the possible configurations of the motion transformation device of the present invention.

Their functions can be illustrated by FIG. 6, which shows one of the possible configurations of the motion transformation device of the present invention. Similar to the general configuration in FIG. 5, a pivot 17 is located at the nodal point of the positioning stage 10 which causes the positioning stage 10 to tilt in response to reaction forces generated during motion. This pivot 17 not only reduces reaction forces transmitted to the supporting structure 12, but it can also provide a fixed point for the positioning stage 10 to rotate about. To restore the position of the positioning stage 10 after tilting, the elastic elements 18, 19 of the damping apparatus 11 are connected between the positioning stage 10 and supporting structure 12 to absorb vibration energy when the positioning stage 10 tilts. This energy will be temporarily stored within the elastic elements 18, 19 and released back to the positioning stage 10 for position restoration to restore the positioning stage 10 to its non-rotary orientation prior to its rotation. Due to the addition of elastic elements 18, 19, some reaction forces would be transmitted to the supporting structure 12, but their magnitudes and frequencies can be modified by the dynamic properties of the elastic elements 18, 19. Thus, it is preferable that elastic properties of the elastic elements 18, 19 are adjustable.

The recovery time of the positioning stage 10 after tilting is governed by the locations and elastic properties of the elastic elements 18, 19 such that the desired recovery time can be tuned. This motion transformation device 13 can be configured to allow one degree of freedom of motion or more if the pivot 17 for a one degree of freedom configuration is a line of nodal pivot points, whereas the pivot (not shown) for a two degrees of freedom configuration is a single pivot point. The motion transformation device for the two degrees of freedom configuration allows the positioning stage to tilt about two horizontal (x, y) axes. The time required for the positioning stage 10 to restore its position can therefore be tuned by modifying the elastic properties of the elastic elements 18, 19 which can be approximated as $T_{settling}=4/\zeta\omega_n$, where $T_{settling}$ is the settling time, $\zeta$ is the damping ratio of the system, and $\omega_n$ is the natural frequency of the system. The softer the elastic elements 18, 19, the lower would be the frequencies of the reaction forces transmitted but the longer would be the recovery time. It is thus a matter of adjusting the elastic properties of the elastic elements 18, 19 for either a shorter recovery time or higher vibration transmission reduction.

The damping apparatus 11 for mounting positioning stages 10 may thus reduce displacements and/or the transmission of forces and provide position restoration for the positioning stages 10 using the elastic elements 18. During the time interval $t_2$, the tilting mechanism allows the positioning stage 10 to tilt about its nodal point at the pivot such that horizontal reaction forces exerted by the positioning stage to its base during motion is transformed into kinetic energy in the positioning stage 10 and elastic energy in the elastic elements 18. Mounting the positioning stage 10 at the nodal point reduces reaction forces that are transmitted to the supporting structure 12 underneath the positioning stage 10. As the positioning stage 10 behaves as a rigid mass after it has been mounted onto the damping apparatus 11, the positioning stage 10 loses its position according to its governing differential equation of motion. The position restoration is obtained at another time interval by introducing a positioning mechanism 14. This mechanism contains mainly active elements which are commanded by a stage position controller 16 synchronized with the motion controller 15.

To restore the equilibrium or non-rotary orientation of the positioning stage 10 after rotation to eliminate any tilting, the positioning mechanism 14 is energized in another time interval $t_3$ by utilizing the positioning mechanism 14. The positioning mechanism 14 preferably contains a damping and locking mechanism as well as one or more positioning actuators. The damping and locking mechanism applies a resistive force to dissipate the kinetic energy of the positioning stage 10 before the positioning stage 10 is restored to its non-rotary orientation. The positioning actuators may then be energized to compensate for any positional errors and acquire the desired position of the positioning stage during this time interval.

Figure 7:
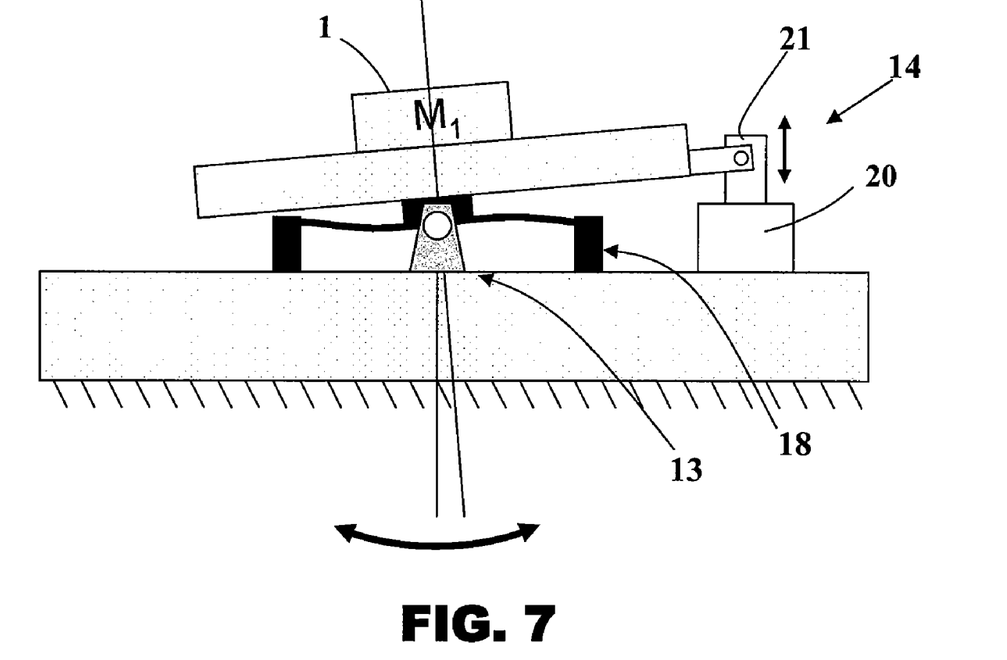
FIG. 7 is a schematic diagram of the preferred embodiment of the invention that incorporates the said motion transformation device of FIG. 6 and which further incorporates a positioning actuator.

FIG. 7 is a schematic diagram of the preferred embodiment of the invention that incorporates the said motion transformation device in FIG. 6, and which further incorporates a positioning actuator 20. As mentioned above, the positioning mechanism 14 includes a damping and locking mechanism and at least one actuator to restore the positioning stage position. When the positioning stage 10 tilts upon excitation by the reaction forces generated by the motion of the positioning stage 10, the damping and locking mechanism is energized and dissipates the positioning stage kinetic energy. The damping and locking mechanism can be a set of dampers and brakes, a magnetorheological fluid brake or an electroactive brake.

Figure 8:
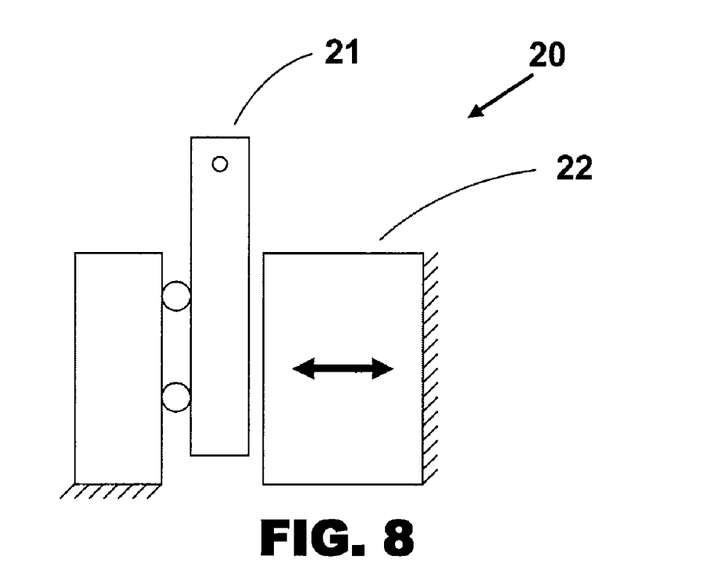
FIG. 8 is a schematic diagram of an exemplary configuration of a friction brake system used in the positioning mechanism of the positioning stage device.

FIG. 8 is a schematic diagram of an exemplary configuration of a friction brake system used in the positioning mechanism of the positioning stage device. In the presently preferred embodiment of the invention, the friction brake as shown in FIG. 8 is used as a damper and also a brake. The friction brake contains a brake actuator 22 fixed on the supporting structure 12 so that it can push against a linkage 21 linked to the positioning stage 10 to use frictional resistance force to resist motion of the linkage 21 and tilting of the positioning stage 10. If the magnitude of actuation of the brake actuator 22 is decreased, the friction brake will be capable of dissipating the kinetic energy of the positioning stage 10 using frictional damping rather than by simply stopping the motion of the positioning stage 10 immediately. The behavior of the brake actuator 22 as a damper and/or brake is thus controlled by its actuation magnitude. The actuation of the brake actuator 22 is realized by electroactive devices, for example, voice coil motors, electroactive actuators or pneumatic actuators. The degree of actuation (which governs the braking or damping state) and timing of actuation are controlled by the stage position controller 16 which is synchronized with the motion signal from the motion controller 15.

Apart from the positioning mechanism 14, there can also be a set of actuators within the positioning actuator 20 to help restore the position of the positioning stage 10 to its non-rotary orientation after tilting. After dissipating the kinetic energy through the damping and locking mechanism, the tilting magnitude of the positioning stage 10 will be almost zero. Due to the existence of hysteresis and friction within the damping apparatus 11, the positioning stage 10 is biased from the real zero position and cannot restore this position simply by using the elastic properties of the elastic elements 18 of the motion transformation device 13. A set of actuators may thus be used to correct this minute bias after tilting. This actuator, like the actuator used in the friction brake, can be a voice coil motor, electroactive actuator, or pneumatic actuator. In the present embodiment, a voice coil motor is used as the actuator for the positioning mechanism 14.

Figure 9:
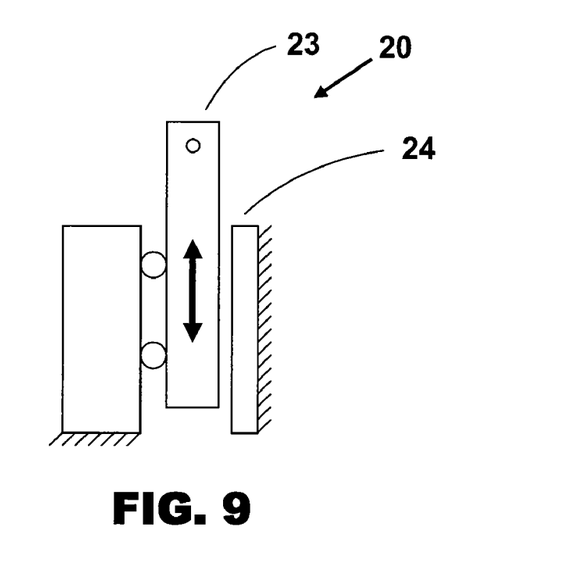
FIG. 9 is a schematic diagram of an exemplary configuration of a voice coil motor system used in the positioning mechanism of the positioning stage device.

FIG. 9 is a schematic diagram of an exemplary configuration of a voice coil motor used in the positioning mechanism of the positioning stage device. This voice coil motor mainly contains a force transmission link 23 and an encoder 24. It is advantageous to use a voice coil motor in the present invention as the force transmission link 23 is free to move when it is not energized. It allows the positioning stage to tilt without introducing an extra force transmission path to the ground. The force transmission link 23 can only position the positioning stage 10 to its original position when it is energized. Another part of a voice coil motor is the encoder 24 which has a reference zero position corresponding to the non-rotary orientation of the positioning stage 10. It cooperates with the voice coil motor and is used to locate the non-rotary orientation of the positioning stage during actuation. The voice coil motor can be oriented to actuate in the vertical direction to correct the position bias after tilting. It is thus one of the advantages to pivot the positioning stage 10 and transform its reaction forces into a predictable tilting motion. The effort for restoring the positioning stage biased position is required in only one vertical direction, no matter whether it is implemented in a point pivot type apparatus or a line pivot type apparatus. For a point pivot type apparatus, another set of damping apparatus will be required in another axis to take into account any tilting along that other axis.

Similar to the damping and locking mechanism described above, the actuation of the voice coil motor is controlled by the stage position controller 16 which is synchronized with the motion signal from the motion controller 15. All the actuation details required by the voice coil motor can be referred to the encoder found in the voice coil motor itself, and the motion signal from the motion controller 15.

Figure 10:
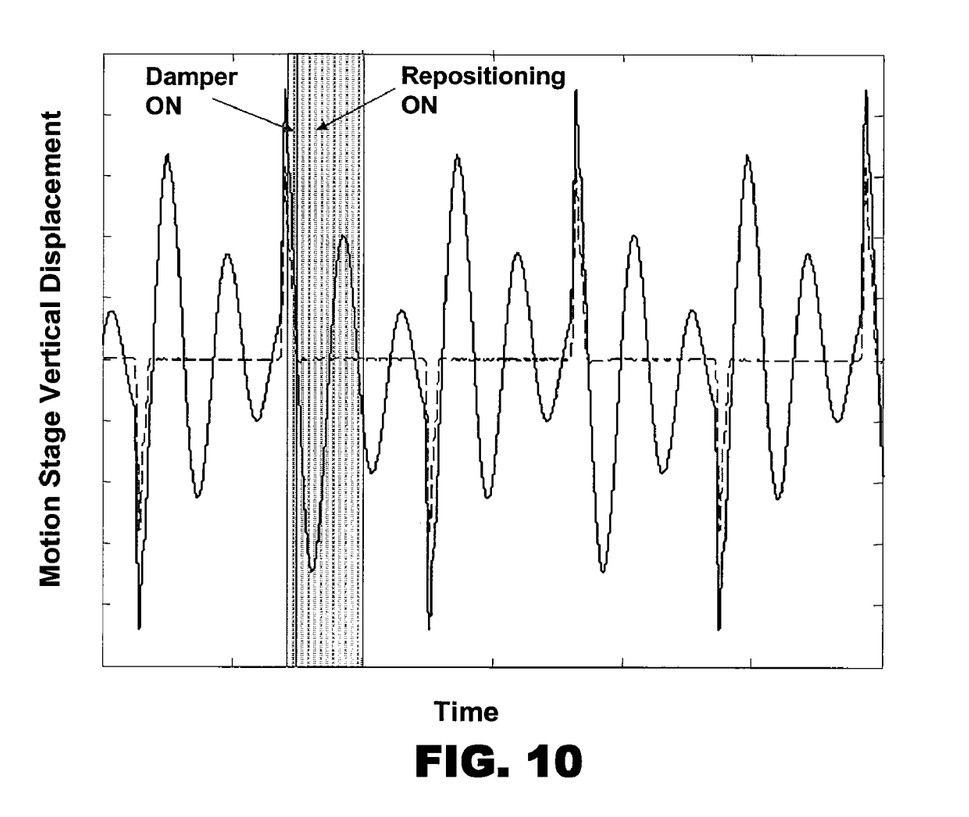
FIG. 10 is a graphical representation of vertical displacements of the positioning stage of the positioning stage device comparing the effects when its damping apparatus is switched off and switched on respectively.

FIG. 10 is a graphical representation of vertical displacements of the positioning stage 10 of the positioning stage device comparing the effects when its damping apparatus is switched off and switched on respectively. The solid line is the vertical displacement of the positioning stage 10 read from the encoder 24 of the voice coil motor before switching on the stage position controller 16. No control from the stage position controller 16 is sent out to the positioning mechanism 14, and the positioning stage 10 oscillates due to the passive behavior of the motion transformation device 13. This oscillation represents the transfer of the positioning stage 10 reaction forces to kinetic energy of the positioning stage represented by the tilting.

Figure 11:
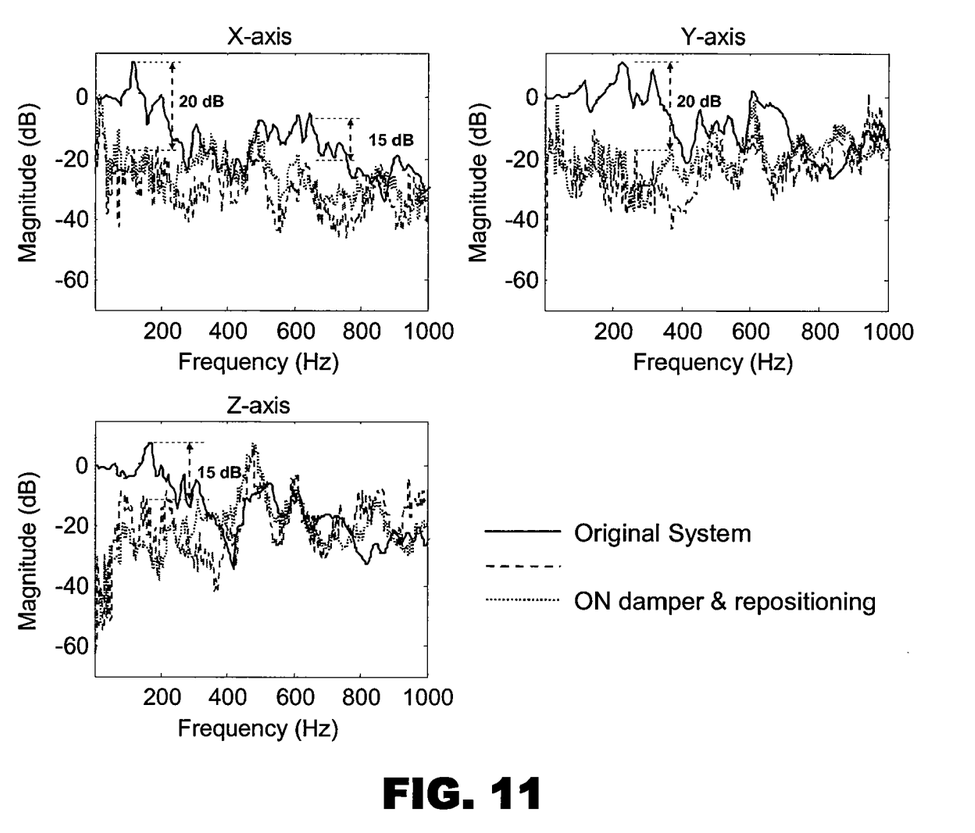
FIG. 11 illustrates transmission spectrums in various axes of a stage device in operation before and after application of the damping apparatus for comparison.

The dotted line is the vertical displacement of the positioning stage 10 after switching on the stage position controller 16. FIG. 10 also illustrates the states when the stage position controller 16 is on. The "switch on" time of the stage position controller 16 is synchronized with the command signal from the motion controller 15 such that the damping apparatus 11 is switched on before the actuator in order to dissipate the kinetic energy of the positioning stage 10. The peak magnitudes of oscillation will drop after the damping apparatus 11 is energized. The oscillation is brought down close to zero by the damping action and the actuator is energized to restore the positioning stage position. In this way, the vibration energy is dissipated during a manageable interval of time without affecting other operations that require precision in other time intervals. From the transmission spectrum shown in FIG. 11, the transmission spectra along the x, y, and z directions of the current invention are shown for comparison. The dotted line is the transmission spectrum of the stage device 24 before applying the current invention while the solid line is the one after applying the current invention. It can be evidenced from the spectrum that low frequency vibrations of lower than 300 Hz are further reduced in all directions by the current invention. It is thus a further advantage of the present invention to reduce vibration transmission and restore its non-rotary orientation in different time intervals.

Therefore, this damping apparatus 11 eliminates the use of bulky reaction masses and achieves vibration transmission reduction and position restoration at different time intervals. Moreover, it provides reference points for effective position restoration. The pivot 17 located at the nodal point of the positioning stage 10 further serves to facilitate repositioning of the positioning stage 10 by limiting reaction forces transmitted to the support structure 12.

This disclosure is illustrative and not limiting. Further modifications will be apparent to one skilled in the art in light of this disclosure and are intended to fall within the scope of the appended claims.

The invention claimed is:

1. A damping apparatus for a positioning stage that is operative to move and position an object along a motion axis, the damping apparatus comprising a motion transformation device operative to rotate the positioning stage about a rotary axis that is substantially perpendicular to the motion axis in response to forces generated to the positioning stage during acceleration or deceleration thereof, resilient elements connected to the positioning stage to reduce vibration transmission, and a positioning mechanism that is operative to restore the orientation of the positioning stage to a non-rotary orientation.

2. The damping apparatus as claimed in claim 1, wherein the motion transformation device comprises a tilting mechanism incorporating a pivot aligned with the rotary axis to allow the positioning stage to rotate about the pivot.

3. The damping apparatus as claimed in claim 2, wherein the pivot is arranged underneath the positioning stage at a vibrational nodal point which encounters the lowest level of vibration when the positioning stage rotates.

4. The damping apparatus as claimed in claim 2, wherein the pivot comprises a line of pivot points.

5. The damping apparatus as claimed in claim 1, wherein the resilient elements are located between the positioning stage and a support structure on which the positioning stage is mounted so as to reduce transmission of reaction forces to the support structure.

6. The damping apparatus as claimed in claim 5, wherein the resilient elements are operative to bias the positioning stage towards its non-rotary orientation prior to its rotation.

7. The damping apparatus as claimed in claim 1, wherein elastic properties of the resilient elements are adjustable.

8. The damping apparatus as claimed in claim 1, wherein the positioning mechanism comprises a damping and locking mechanism and at least one positioning actuator.

9. The damping apparatus as claimed in claim 8, wherein the damping and locking mechanism is operative to apply a resistive force to dissipate kinetic energy of the positioning stage during its rotation.

10. The damping apparatus as claimed in claim 8, wherein the damping and locking mechanism comprises a friction brake for resisting motion of the positioning stage during its rotation.

11. The damping apparatus as claimed in claim 10, further comprising an electroactive device coupled to the friction brake for controlling an actuation magnitude of the friction brake.

12. The damping apparatus as claimed in claim 8, wherein the positioning actuator is connected to the positioning stage by a linkage and is operative to restore the non-rotary orientation of the positioning stage by driving the linkage.

13. The damping apparatus as claimed in claim 12, wherein the positioning actuator comprises a voice coil motor.

14. The damping apparatus as claimed in claim 13, including an encoder, having a reference zero position corresponding to the non-rotary orientation of the positioning stage, that is operative to cooperate with the voice coil motor for locating the non-rotary orientation of the positioning stage.

15. The damping apparatus as claimed in claim 1, wherein the actions and timing of the damping apparatus are responsive to control signals from a stage position controller for controlling the motion of the positioning stage, the stage position controller operating in response to motion commands from a motion controller.

16. Method for damping vibrations of a positioning stage for moving and positioning an object along a motion axis, comprising the steps of: driving the positioning stage to move the object along the motion axis, rotating the positioning stage about a rotary axis that is substantially perpendicular to the motion axis in response to forces generated to the positioning stage during acceleration or deceleration thereof using a motion transformation device, reducing vibration transmission with resilient elements connected to the positioning stage, and restoring the orientation of the positioning stage to a non-rotary orientation with a positioning mechanism.

17. Method as claimed in claim 16, wherein the motion transformation device comprises a tilting mechanism incorporating a pivot aligned with the rotary axis to allow the positioning stage to rotate about the pivot and comprises resilient elements connected to the positioning stage.

18. Method as claimed in claim 16, further comprising the step of dissipating kinetic energy of the positioning stage during its rotation by applying a resistance force against its rotational motion.

* * * * *